United States Patent [19]
Sin et al.

[11] Patent Number: 5,982,004
[45] Date of Patent: Nov. 9, 1999

[54] POLYSILICON DEVICES AND A METHOD FOR FABRICATION THEREOF

[75] Inventors: Johnny Kin On Sin, Shatin; Anish Kumar Kottarath Parambil, Sai Kung, both of The Hong Kong Special Administrative Region of the People's Republic of China

[73] Assignee: Hong Kong University of Science & Technology, Kowloon, The Hong Kong Special Administrative Region of the People's Republic of China

[21] Appl. No.: 08/879,886

[22] Filed: Jun. 20, 1997

[51] Int. Cl.[6] ................................... H01L 27/01
[52] U.S. Cl. .................. 257/347; 257/348; 257/350; 257/316
[58] Field of Search ................... 257/347, 348, 257/350, 352, 353, 316

[56] References Cited

U.S. PATENT DOCUMENTS 5,124,768  6/1992  Mano et al. ..................... 357/23.7
5,418,391  5/1995  Huang ............................ 257/336
5,574,294  11/1996  Shepard .......................... 257/66

*Primary Examiner*—Sara Crane
*Attorney, Agent, or Firm*—Burns, Doane, Swecker & Mathis, L.L.P.

[57] ABSTRACT

The present invention provides a novel thin film transistor device having the advantages of both conventional thin and thick film devices. The channel region of the device is elevated with respect to the source and drain regions by being made as a thin film while the source and drain regions are relatively thick. Such an arrangement provides high drive current characteristics of a thin film device, whilst mitigating the disadvantageous kink effect in the IV curve and the off-state leakage current known in conventional thin film devices. The invention also provides a fabrication method, and this method may also be employed to manufacture other novel semiconductor devices including EEPROM devices, large double layer storage capacitors and a novel conductivity modulated thin film transistor.

2 Claims, 7 Drawing Sheets

5,982,004

POLYSILICON DEVICES AND A METHOD FOR FABRICATION THEREOF

FIELD OF THE INVENTION

This invention relates to novel designs of semiconductor devices and to a method for their fabrication. In particular the present invention relates to a novel thin film transistor, and in particular to such a transistor having advantages of both conventional thin and thick film devices including high drive current and low leakage current in the off state. The transistor has application in particular, but by no means exclusively, in the field of display technology, for example in active matrix LCDs (AMLCDs). The fabrication method for this transistor may also, however, be adapted to manufacture other novel semiconductor devices including semiconductor capacitance devices, EEPROM devices, and conductivity modulated thin film transistors.

BACKGROUND OF THE INVENTION

Thin film transistors (TFTs) fabricated on polycrystalline silicon (polysilicon) have gained much attention in flat panel displays such as active matrix LCDs and in static random access memory units. In the future it can be expected that the degree of circuit integration will continue to increase as device characteristics improve further, so that an entire system will be formed on a single panel. In addition, in flat panel displays polysilicon thin film transistor technology enables the integration of row and column drive circuitry, and also additional functionality such as image reversal, aspect ratio control and level shifting among others. In addition to display elements and circuitry (both analog and digital), memories, solar cells, touch sensors and other sensors may all be integrated on the panel. For example, electrically erasable and programmable read only memories (EEPROMS) have been fabricated using a polysilicon TFT process.

In comparison with thick film devices TFT devices made with a thin film have the advantages of lower grain boundary trap density, higher mobility, and higher on-state current. It is desirable to make the thin film transistor as thin as possible in order to provide a high supply current in the on-state.

However, thin film devices experience a higher lateral electric field, in particular at the junction between the channel and drain which arises from the reduced junction depth. This increase in lateral electric field is known to be a major cause of impact ionisation in the channel/drain region which results in the accumulation of holes. These holes are known to be the cause of a pronounced "kink" effect in the IV characteristics of a TFT device which in turn degrades the output characteristics of the device, and in particular reduces output resistance at high drain voltages and its gain, see for example M. Valdinoci. L. Colalongo, G. Baccarani. G. Fortunato, A. Pecora and I. Policicchio, "*Investigations on the Kink Effect in Poly-TFTs*", Proceediings of the ESSDERC, pp. 1055–1058, 1996 and A. G. Lewis, T. Y. Huang, R. H. Bruce, M. Koyangi, A. Chiang and I. W. Wu, "*Polysilicon Thin Film Transistor for Analogue Circuit Applications*", IEDM Tech. Digest, pp. 264–267, 1988. In addition the kink effect also causes avalanche induced short channel effects.

Furthermore the high lateral electric field causes anomalous leakage current in the off state that counteracts the benefit provided by a thin film in which the lower trapped charge content would otherwise tend to reduce leakage current. This anomalous leakage current is a serious problem in poly-Si TFTs.

SUMMARY OF THE INVENTION

According to the present invention there is provided a thin film transistor device, comprising source and drain regions formed of doped polysilicon and interconnected by a polysilicon channel region, wherein said channel region is of a reduced thickness in comparison with said drain region.

By means of this arrangement the advantages of a thin channel region are maintained (notably high drive current and lower trapped charge content), while the problem of higher lateral electric field at the junction of the channel region and the drain is mitigated.

Preferably the source region is also of a greater thickness than the channel region, and a particularly convenient manner of constructing the device would be for the source and drain regions to be of the same thickness. Possibly, however, advantages over the prior art may in some circumstances also be obtained by providing the source and channel of greater thickness, with the drain region being of smaller thickness. Such a situation may, for example, arise in an EEPROM application of the invention.

Preferably the device is a double gated device. In a particularly preferred arrangement one of the gates may be located substantially in a space defined by said channel region being of reduced thickness compared to the drain or source region. By tieing the two gates together increased source-drain current may be obtained.

The channel region may be of a thickness as low as about 200 Å, though a thickness of about 800 Å would be more typical. Typical thicknesses for the drain region (and also the source region when that is of increased thickness) are about 3000 Å.

According to the present invention there is further provided a method for forming a semiconductor device on an insulating substrate, comprising the steps of:

(a) depositing a first polysilicon layer on said substrate in a desired pattern, (b) depositing a first oxide layer on said substrate and on said first polysilicon layer, (c) depositing a second polysilicon layer on said first polysilicon layer and on at least a part of said substrate to at least one lateral side of said first polysilicon layer, (d) depositing a polish stop oxide layer of a predetermined thickness surrounding said second polysilicon layer, (e) chemical-mechanical polishing said second polysilicon layer until said layer has a maximum thickness equal to said thickness of said polish stop layer, (f) depositing a second oxide layer, and (g) depositing a third patterned polysilicon layer.

By means of this arrangement not only may a thin film transistor as described above be manufactured, but so may other novel semiconductor devices including large storage capacitors, memory units and high voltage drivers, comprising a sandwich of three polysilicon layers wherein the middle layer has different thicknesses in different parts of the layer, in particular where the middle polysilicon layer is in the form of thin film where it directly overlies the first layer, and is a thick film where it extends to one or both sides of the first layer. The insulating substrate may, for example, be silicon dioxide on a silicon wafer or a glass.

According to a further aspect of the invention therefore, there is provided a semiconductor capacitor formed on an insulating substrate and comprising, a first polysilicon layer deposited on said substrate as a bottom gate, a first oxide layer deposited over said substrate and said bottom gate, a second polysilicon layer deposited over said bottom gate and over said substrate to at least one side of said bottom gate, a second oxide layer deposited over said second polysilicon layer, and a third gate deposited on said second oxide layer as a top gate, said top and bottom gates being electrically connected.

According to another aspect of the present invention there is provided a semiconductor memory unit formed on an insulating substrate and comprising, a first patterned polysilicon layer formed on said substrate and comprising a back plate, a first oxide layer on said first polysilicon layer and on said substrate, a second polysilicon layer comprising a thin drain region over said back plate and relatively thick source and channel regions to one side of said back plate, a second oxide layer on said second polysilicon layer and on said first oxide layer, a third polysilicon layer on said second oxide layer and generally overlying said channel region and serving as a floating gate, a third oxide layer formed on said floating gate and said second oxide layer, and a fourth polysilicon layer comprising a control gate and deposited on said third oxide layer over said floating gate.

According to yet another aspect of the present invention there is provided a thin film transistor comprising a source and a drain, each being formed of a doped polysilicon material on an insulating substrate, said source and said drain being spaced apart by undoped polysilicon material which forms the channel region and by an offset region, wherein said source comprises primarily a material of one conductivity and said drain comprises a material of opposite conductivity, whereby in said offset region conduction is by both electron and hole carriers, and wherein said channel region comprises a polysilicon layer sandwiched between front and back gates and wherein said channel region is thin compared to said offset region and said source and said drain.

BRIEF DESCRIPTION OF THE DRAWINGS

Some embodiments of the invention will now be described by way of example and with reference the accompanying drawings, in which.

DETAILED DESCRIPTION OF PREFERRED EMBODIMENTS

Figure 1:
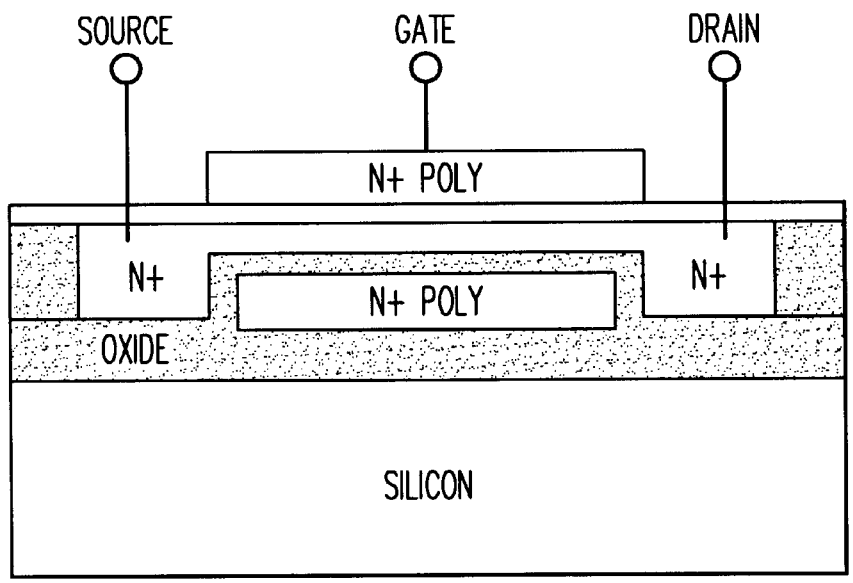
FIG. 1 is a cross-section through an embodiment of a thin film transistor device according to a first embodiment of the present invention.

FIG. 1 shows in cross-section an elevated channel thin film transistor (ECTFT) according to a first embodiment of the invention. The ECTFT is a self-aligned structure with a channel region thickness of approximately 800 Å and source and drain regions of a thickness of approximately 3000 Å. The ECTFT of FIG. 1 is a double-gate structure fabricated on polysilicon using a simple low temperature (below 600° C.) process.

FIG. 3 illustrates a fabrication method for the ECTFT of FIG. 1. A silicon wafer with a thermally grown oxide layer 5000 Å thick was used as the starting substrate. On this substrate a 2000 Å layer of polysilicon was deposited and then doped $N^+$ and patterned as the back gate. A layer of 1000 Å LPCVD (low pressure chemical vapour deposition) oxide was deposited as back gate oxide and annealed at 600° C. A 5000 Å silicon layer was then deposited at 550° C. in amorphous form by LPCVD and subsequently crystallized using a standard solid phase recrystallization method (20 hours in nitrogen ambient at 600° C.). After thus forming a polysilicon island (FIG. 3(a)), a 3000 Å LTO (low temperature oxide) was deposited and patterned using the negative of the island mask (FIG. 3(b)). This oxide is used as a polish stop oxide. The wafer was then chemo-mechanically polished down to the polish stop (FIG. 3(c)) using a Strasbaugh 6-DT single wafer polisher. Due to the excellent selectivity between polysilicon and LTO during polishing, a very good control of the polysilicon film thickness can be achieved. After polishing, the surface topology becomes flat all over the wafer. A 1000 Å APCVD (atmospheric pressure chemical vapour deposition) oxide was then deposited as a front gate oxide, and gate polysilicon was then patterned and a self-aligned $N^+$ implantation was performed (FIG. 3(d)). A 3000 Å LTO was used as an inter-level dielectric. Using a VIA hole, the front and back gates are contacted. The back gate can be a patterned transparent ITO (indium tin oxide).

After the metallization and patterning, the devices were hydrogenated using r.f. $H_2$ plasma for 2 hours.

The resulting ECTFT is shown in FIG. 1. It will be seen that the device comprises a thin channel region 1 and thicker drain 2 and source 3 regions. In this embodiment the thickness of the channel region is about 800 Å and of the drain and source regions about 3000 Å. Thus the channel region is physically "elevated" relative to the source and the drain regions. One immediate advantage of this structure is that it provides a convenient space beneath the channel region for the provision of the back gate 4. The use of a double-gate structure is particularly advantageous since it provides a higher drive current than a single gate structure since the back gate can be tied to the front gate so that current flows in the channel regions adjacent to both back gate 4 and front gate 5.

The fact that the channel region is thin allows for high drive current and low trapped charge density as in conventional TFT devices, but by forming the ECTFT with a much thicker drain region the problems discussed above with regard to a high lateral electric field, in particular at the channel/drain junction, causing impact ionisation, are mitigated. As will be seen below the ECTFT of the present invention has low leakage current in the off-state and improved IV characteristics in the on-state in comparison with conventional TFTs.

For comparison with the ECTFT of FIG. 1 a conventional TFT device with uniform source/channel/drain thickness of 800 Å and a thick film device with a uniform thickness of 3000 Å were also fabricated in the same run. A comparison of the IV characteristics of the conventional thin film and thick film devices with the ECTFT of the present invention is shown in FIG. 2

Figure 2A:
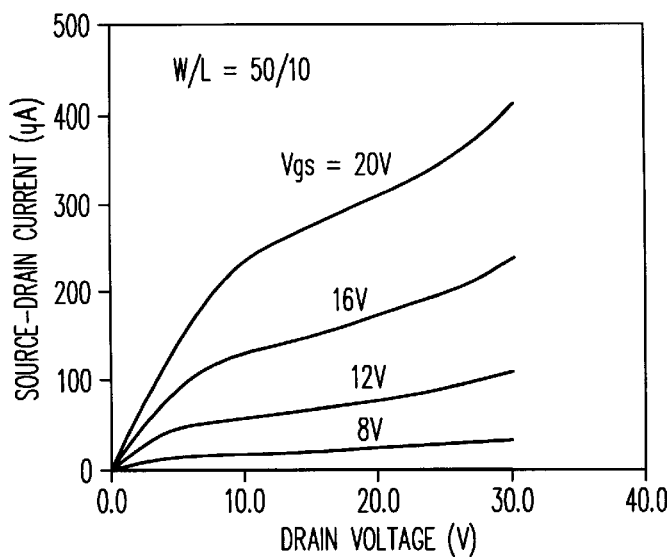
FIGS. 2(a)–(c) are IV plots for thin film transistors according to the prior art FIGS. 2(a) & (b)) and according to the embodiment of FIG. 1(FIG. 2(c))

FIG. 2(a) shows the IV characteristics of a thin film device with a uniform thickness of 800 Å in the channel and source/drain regions. A large kink on the IV curve is observed and the current increases rapidly with increasing drain voltage and this is particularly so with large values of the gate voltage. This is due to the impact ionisation in the device at higher drain voltages induced by the high electric field at the channel/drain region. This increase in electric field in the thin polysilicon film is due to the two-dimensional effect caused by the decrease in drain junction depth.

Figure 2B:
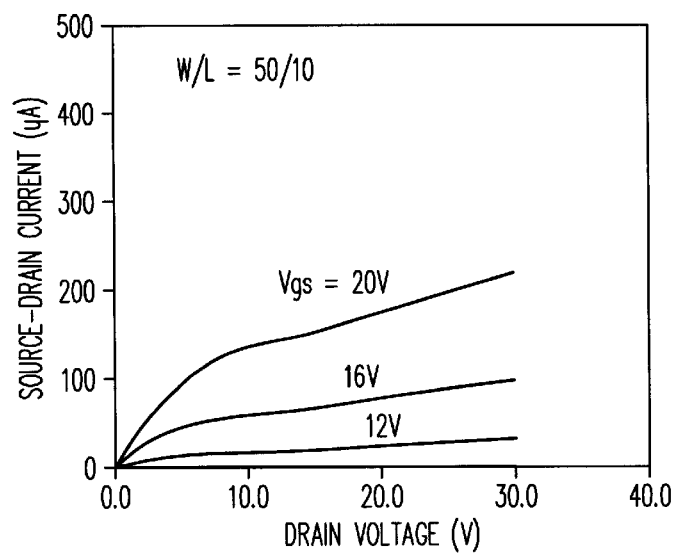

Consequently the "kink" is less pronounced with a thicker source/channel/drain structure and this is confirmed by FIG. 2(b) which shows the IV characteristics of a 3000 Å thick film device. It can be seen that as the thickness of the device increases the kink effect is reduced due to the reduction of the lateral electric field. However, the kink is far from being eliminated completely and this is due to the high content of grain boundary trapped charges present in the thick polysilicon film at the channel/drain junction area in which even a reduced electric field can still cause impact ionization.

Figure 2C:
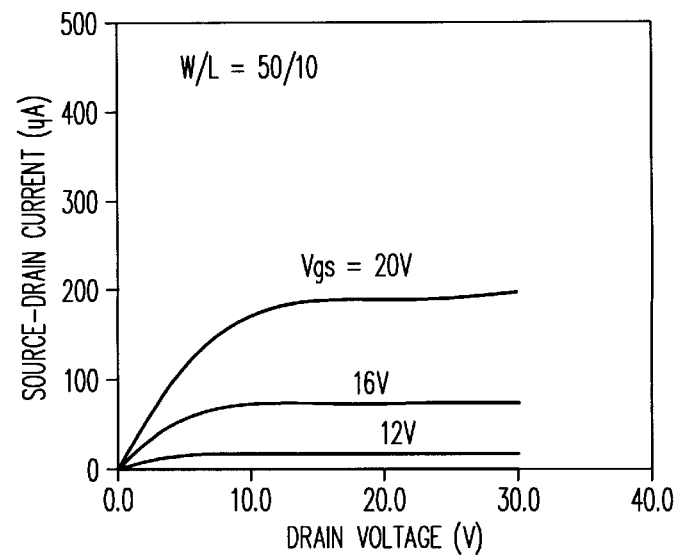
Figure 3A:
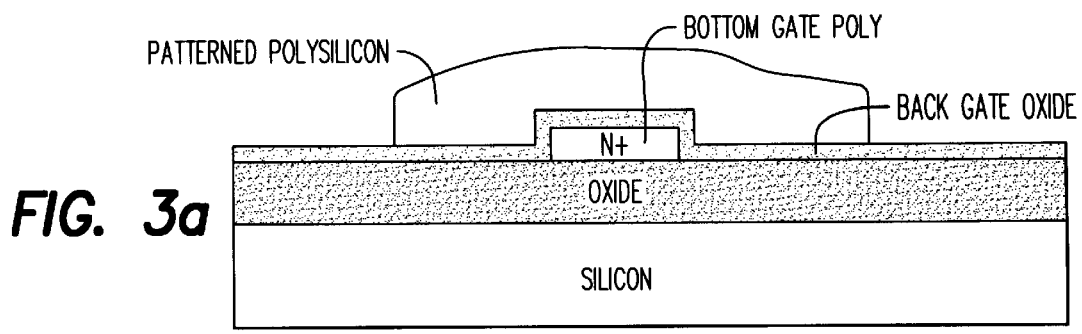
FIGS. 3(a)–(d) show schematically a method of fabricating the device of FIG. 1.
Figure 3B:
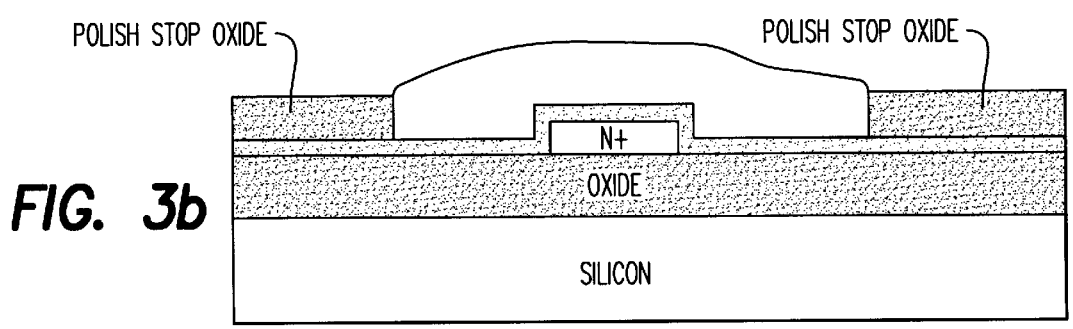
Figure 3C:
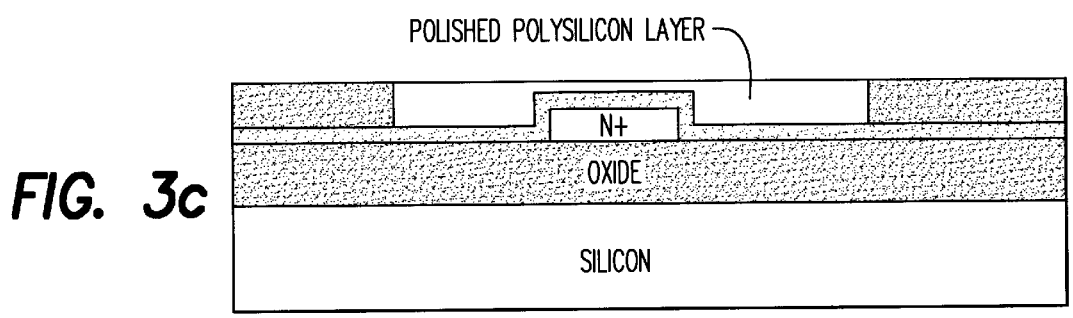
Figure 3D:
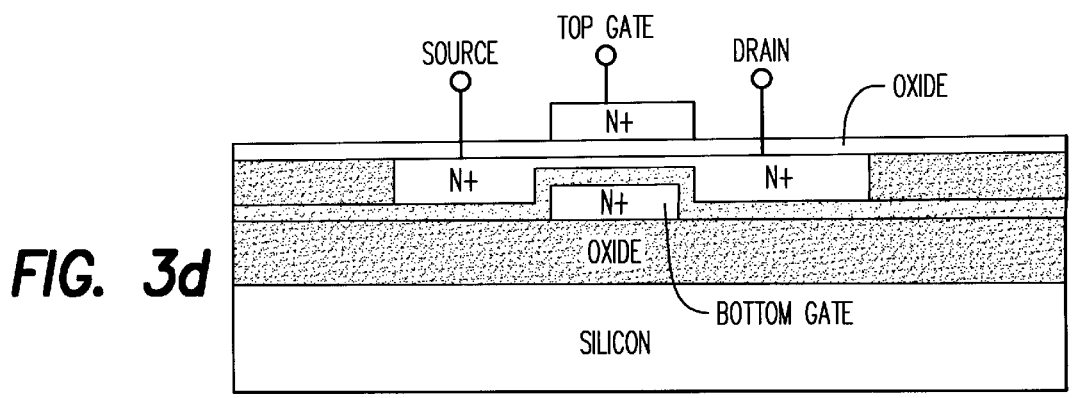

FIG. 2(c) shows the IV characteristics of an ECTFT according to an embodiment of the present invention. It is apparent from FIG. 2(c) that in the present invention the kink effect is almost completely eliminated and that above a drain voltage of about 10V the source-drain current is constant for a given gate voltage. This is due to the relaxed lateral electric field at the drain/channel junction and also the reduction in trapped charges in the thin channel region.

In a structure of the present invention the output resistance is substantially improved. At a drain voltage of 5V and a gate voltage of 20V a 40% reduction in on-state current is observed for the thick film device of FIG. 2(b) compared to the thinner device of FIG. 2(a), whereas only a 20% reduction in on-state current is observed for the ECTFT without a back-gate bias compared to the thin film device. Therefore an approximately 30% improvement is observed for the ECTFT compared to a thick film device. This 30% improvement is due to the thinner channel region and the enhancement of electron mobility at the channel surface of the ECTFT after the chemo-mechanical polishing. The major factors in the reduction in drain current in the thick film device compared to the thin film device are the larger amount of grain boundary trap charges in the thick channel region and the reduction in the lateral electric field. In the case of a thin film device (as in FIG. 2(a)) since the lateral electric field is very high, the impact ionisation is increased due to the increase in lateral electric field. This is the reason for the 20% reduction in on-state current in the ECTFT compared to the thin film devices.

By using the back gate tied to the front gate higher output current can be achieved. Using both front and back gates it is observed experimentally that the drain current is increased by over 50% in the saturation region. In theory the drain current should be increased by about 100% if both the front and back gates oxide were deposited by APCVD. However, in the abovedescribed embodiment the LTO deposited for the back gate has a higher fixed charge compared to the APCVD oxide deposited for the front gate. Thus, only a 50% increase in saturation current is obtained.

In addition to the improved IV characteristics of the ECTFT according to the invention in comparison with conventional thick and thin film transistors, the ECTFT of the present invention also provides significantly improved performance in terms of leakage current in the off-state.

Figure 4:
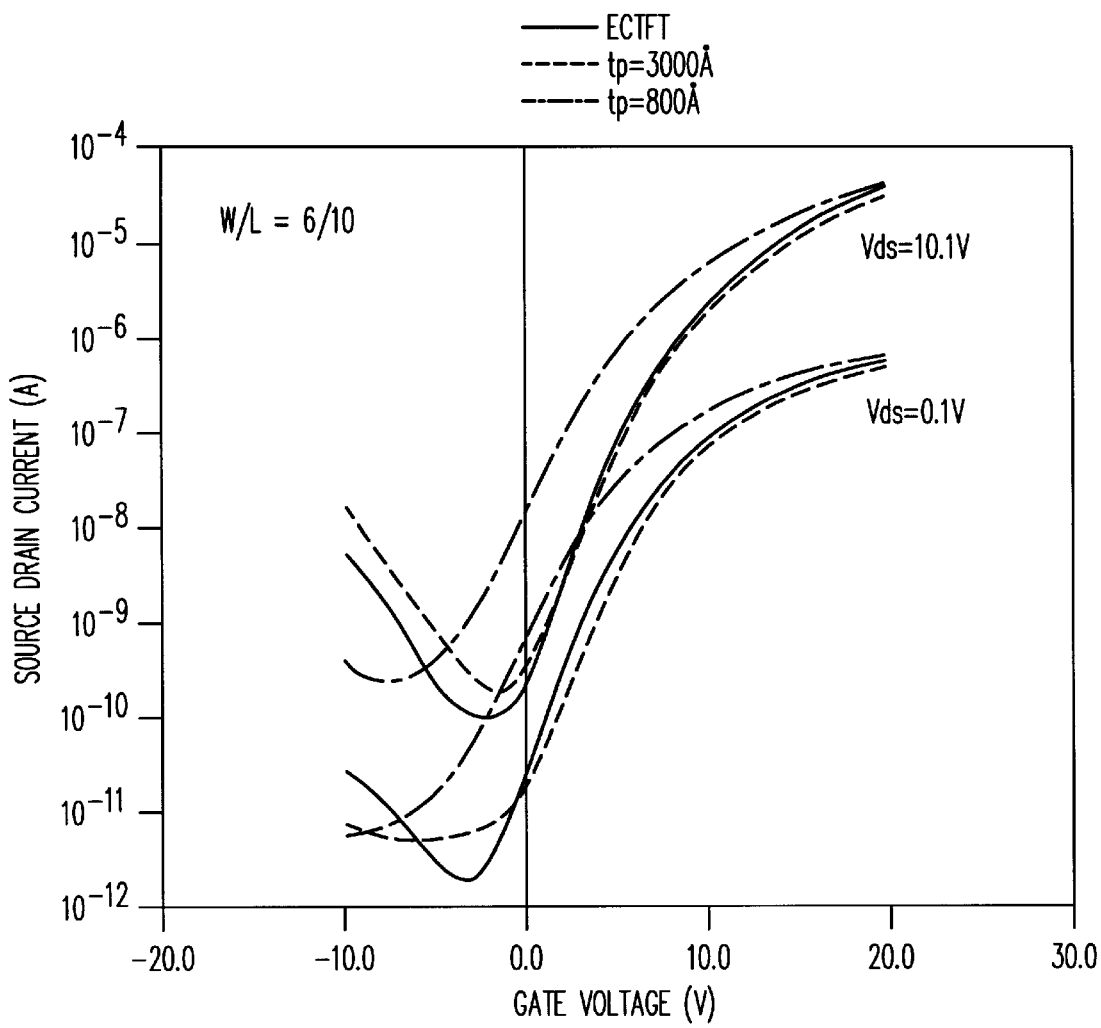
FIG. 4 shows source-drain current as a function of gate voltage for a thin film transist or in accordance with the embodiment of FIG. 1 and in accordance with the prior art for comparison.

FIG. 4 shows the measured gate transfer characteristics of the ECTFT of FIG. 1 compared with conventional thick (3000 Å) and thin (800 Å) film devices. From considering the source-drain current at 0V gate voltage, ie the leakage current in the off-state, it can be seen that the ECTFT of the present invention has a leakage current comparable with that of a conventional thick film device and over 15 times lower than that of a thin film device at zero gate bias.

Thus it will be seen that there is described a novel elevated channel thin film transistor that effectively combines some of the best features of both thick and thin film devices. The transistor exhibits kink effect free IV characteristics, low leakage current at least equal to thick film devices, and high on-state current at least comparable with conventional TFT devices. Furthermore, in short channel VLSI devices where the source/drain series resistance is much higher than the channel resistance, the ECTFT structure will have the additional advantage of reduced source/drain series resistance due to the use of thick source and drain regions. These features make the present invention very suitable for use in high definition active matrix LCD applications where the pixels, driver circuits, and other peripheral analogue circuit building blocks as well as memory devices are all fabricated on the same glass substrate. ECTFT devices made in accordance with the present invention will also be very useful for fabrication in a stacked 3D CMOS process for static RAM applications.

The ECTFT devices according to the present invention have a large number of possible applications. In particular they may be employed in systems formed in panels, for example as a pixel transistor, digital and analogue circuit elements, as a large storage capacitor, and as a memory unit. The ECTFT as described above may be used for both analogue and digital circuit applications. Since the device exhibits kink-free IV characteristics, the output resistance of the device is improved thereby increasing the gain. For digital and pixel applications the device can be switched with small on-resistance and thus the ECTFT can be used as pixel transistors, digital and analogue circuit elements.

Figure 5:
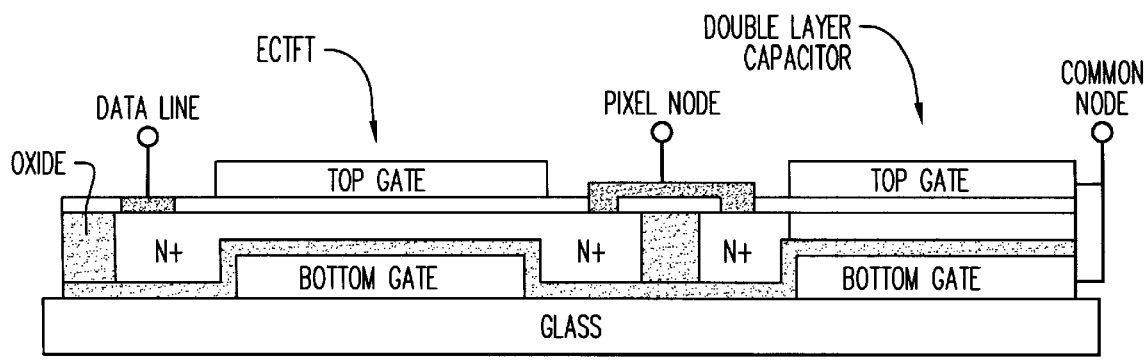
FIG. 5 shows in schematic cross-section a semiconductor capacitance device in accordance with an embodiment of the present invention.

In an active matrix liquid crystal display (AMLCD) a large storage capacitance is employed to suppress the image flickering and crosstalk. However, a large area storage capacitor will reduce the aperture ratio and image brightness. Using the invention, a double-layer large storage capacitor with much reduced area can be fabricated using the front and back-gates linked by a common node to serve as capacitance plates. FIG. 5 illustrates such an arrangement.

Figure 6:
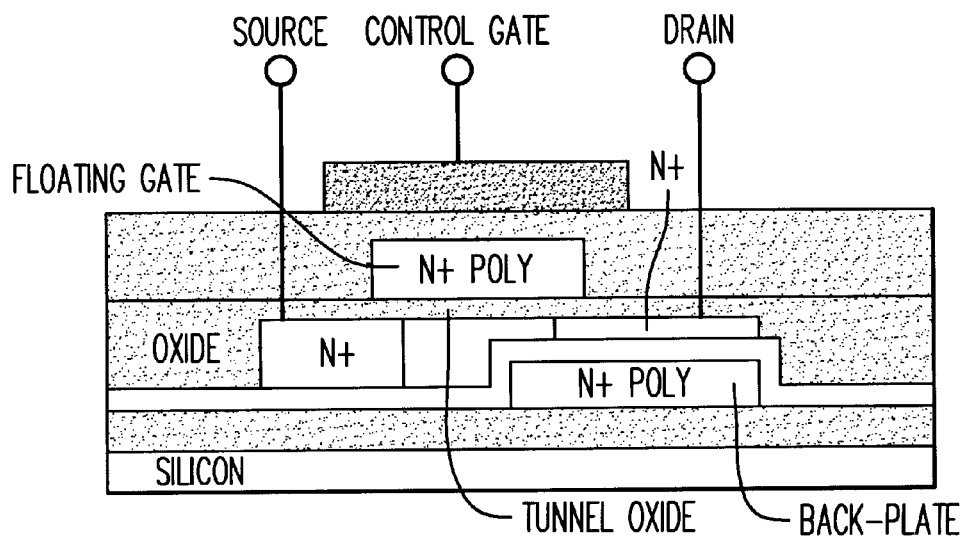
FIG. 6 shows in schematic cross-section an electronically erasable and programmable read only memory unit in accordance with an embodiment of the present invention.

FIG. 6 illustrates the use of the invention in the manufacture of a memory unit, for example an EEPROM cell. Using the ECTFT process a patterned back polysilicon layer can be selectively placed so that the various locations of the active polysilicon can be elevated. With the drain region raised appropriately, and when the device operates in the strong inversion regime, the avalanche induced current can be enhanced. This approach can be utilised to program/erase an EEPROM cell fabricated on a non-uniform film as shown in FIG. 6. This memory cell may be described as an elevated drain EEPROM (ED-EEPROM).

An ED-EEPROM and an EEPROM without back plate are simulated for comparision. A single-crystal silicon model is used. To estimate the effect of the enhanced avalanche induced current in the ED-EEPROM structure using the single crystal silicon model, the channel length used for the device should be reduced since the avalanche effect only occurs at small channel length for Si devices. The simulated ED-EEPROM has a back-plate extension of 0.5 $\mu$ from the gate edge near the drain into the chanel region. For all devices the effective channel length is 1.5 $\mu$, channel doping is $1\times10^{17}$ cm$^{-3}$, inter poly oxide thickness is 400 Å, floating gate oxide thickness is 250 Å, the source junction depth is 0.3 $\mu$ and drain junction depth is 0.05 $\mu$. The substrate is grounded for the EEPROM without back-plate.

The cell can be programmed via avalanche channel hot-electron injection from the drain pinch-off region. The simulated bias voltages to write and erase the cell are tabulated in Table 1.

TABLE 1

Write/Erase Biases

| | |
|---|---|
| Write | Drain=5V, Control Gate=12V, Floating Gate=4V, Back-plate=−4V and Source=0V |
| Erase | Source=8V, Control Gate=−12V, Floating Gate=−4V, Back-plate=−4V and Drain=0V |

Figure 7:
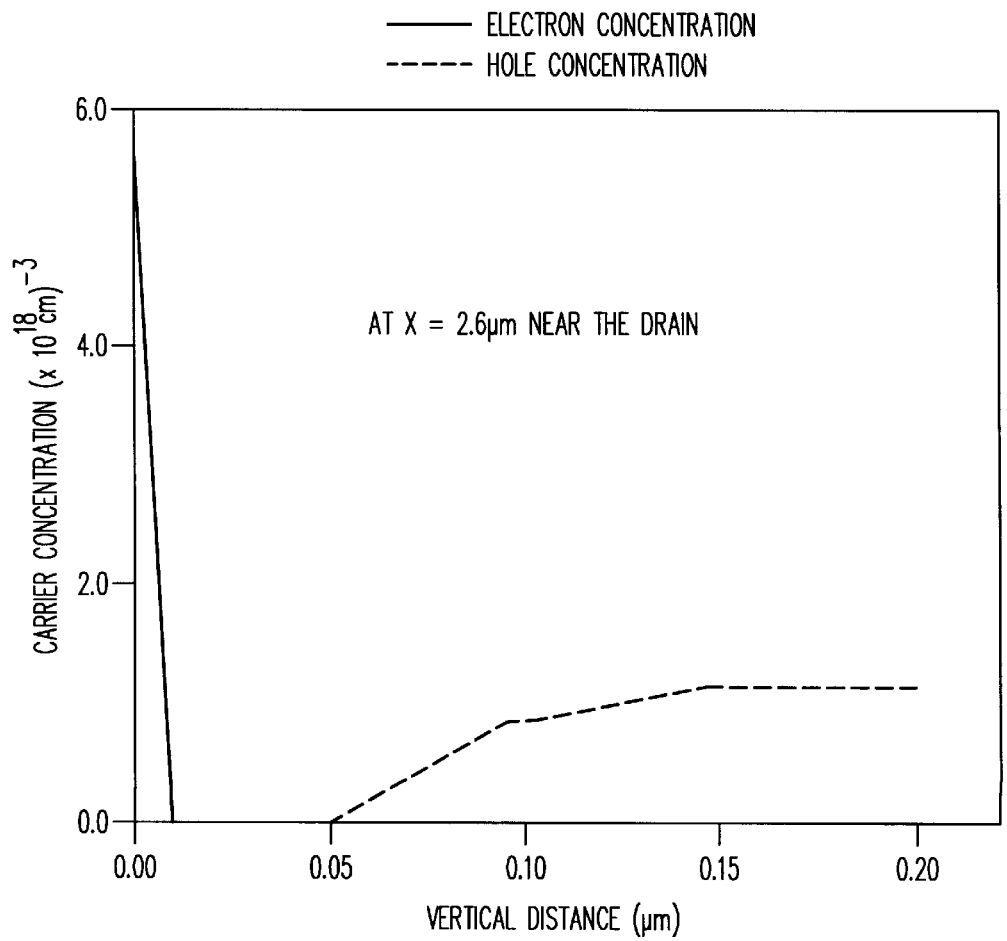
FIG. 7 shows the carrier concentration near the drain region in the device of FIG. 6.

The back-plate of the ED-EEPROM is biased at −4V so that the back-interface near the drain is in accumulation. Thus, hole concentration near the drain is increased so that it acts like a Zener diode. The carrier concentration near the drain region during programming is plotted in FIG. 7. This Zener action helps to increase the hot carrier generation at the drain region, and the hot electrons are injected into the floating gate oxide due to the high electric field across the control gate and the drain. The Zener action can be further enhanced if the body of the transistor is connected to the source through a body contact.

To erase the cell, Fowler-Nordheim (FN) current flowing through the gate oxide is used. A positive bias is applied to the source and a high enough negative bias is applied to the control gate, thereby pushing the electrons from the floating gate into the active polysilicon film. The back-plate may be grounded or biased at the accumulation.

Figure 8:
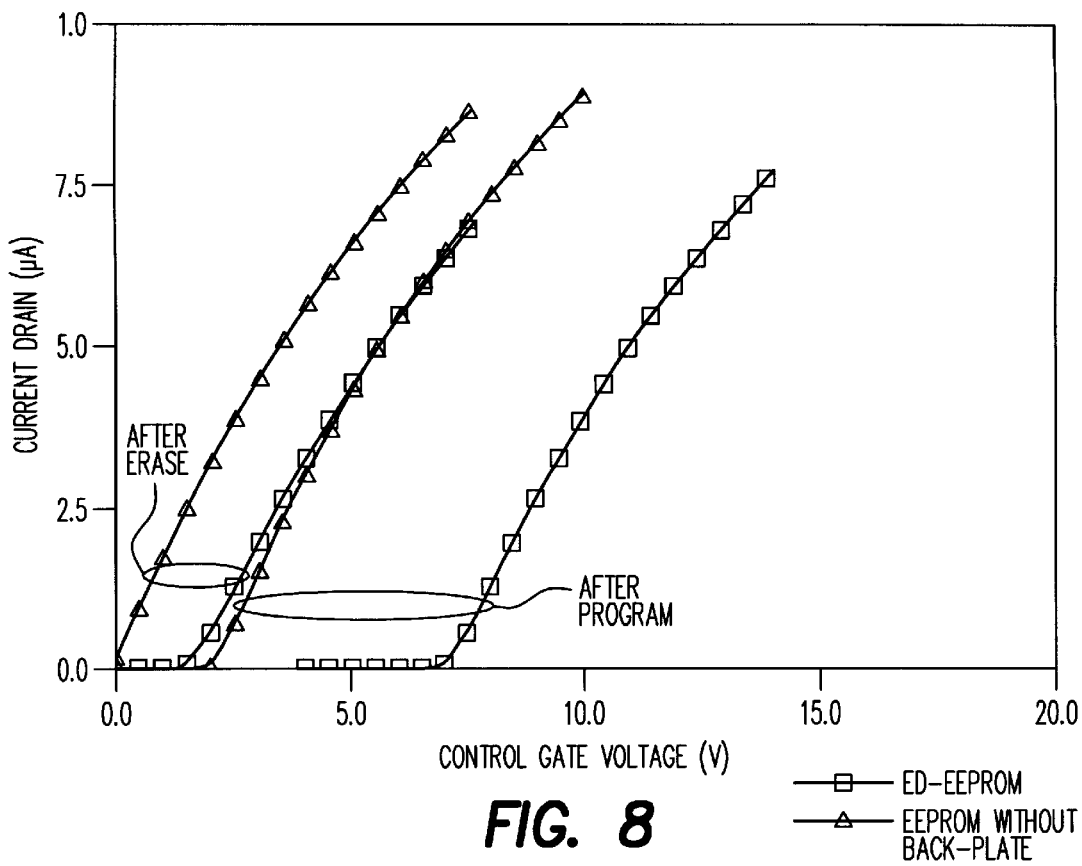
FIG. 8 shows the drain current against gate voltage during programming and erasing of device of FIG. 6, FIG. 9 a schematic cross-section in perspective of a conductivity modulated thin film transistor in accordance with an embodiment of the present invention.

FIG. 8 shows the drain current versus control gate voltage after the programming and erasing. ED-EEPROM shows a larger threshold voltage change with a window of 5V, whereas the EEPROM without back-plate shows a threshold voltage window of 2V. The write/erase time of the cells are tabulated in Table 2.

TABLE 2

Write/Erase Time

| Devices | Write time | Erase time |
|---|---|---|
| EEPROM without back-plate | 50 $\mu$s | 0.1 ms |
| ED-EEPROM | 2 $\mu$s | 0.1 ms |

The ED-EEPROM is faster in writing due to the enhanced impact ionisation of the thin drain and the accumulation of the back interface near the drain region. The programming time of the ED-EEPROM is 2 $\mu$s; whereas the EEPROM without back-plate shows a programming time of 50 $\mu$s. Both of them show an erase time of 0.1 $\mu$s.

In co-pending application Ser. No. 08/504,337, assigned to the assignee of the present application, there is disclosed a conductivity modulated TFT (CMTFT) which solves certain current pinching problems in conventional TFT devices.

The CMTFT is a mixed carrier device which uses minority carriers (holes) injected from the p$^+$ drain to enhance current conduction. In the on-state, the injected holes conductivity modulate the high resistivity offset region and thereby the offset resistance is reduced. In order to obtain higher current drive the injection efficiency of holes at the anode has to be optimized and to do so the junction area at the p$^+$ drain has to be increased by increasing the film thickness. However, increasing the film thickness uniformly will have adverse effects on the threshold voltage and on-state current of the device.

Figure 9:
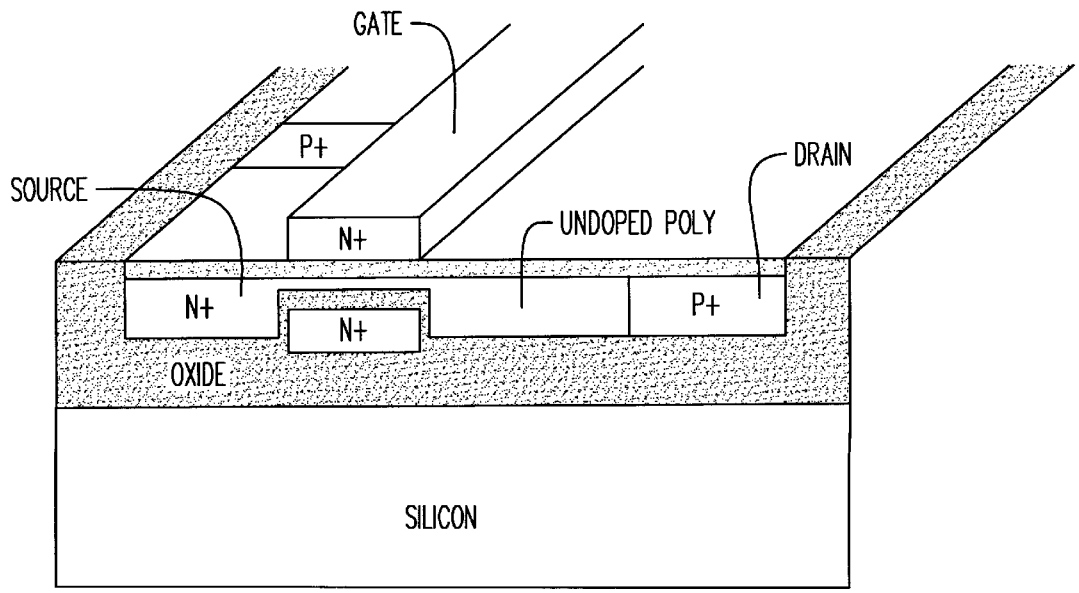
Figure 10:
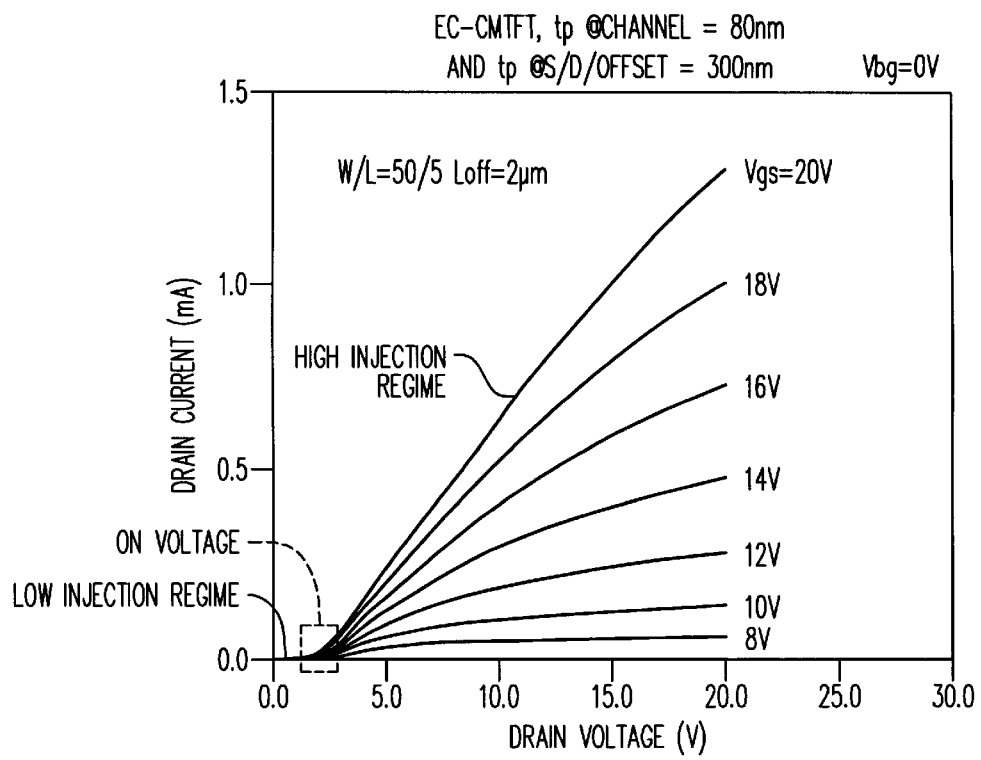
FIG. 10 shows the IV characteristics of the transistor of FIG. 8 with zero back gate bias.

To overcome this drawback an elevated channel conductivity modulated thin film transistor (EC-CMTFT) is shown in FIG. 9. The EC-CMTFT has a channel region thickness of approximately 800 Å and a source/drain/offset region thickness of approximately 3000 Å. The thin channel region is used to achieve high electron current, and the thick drain is used to increase injection of holes from the p$^+$ drain. In this way an efficient conductivity modulation is achieved by the thick offset region. FIG. 10 shows the IV characteristics of the EC-CMTFT with zero back-gate bias. The combined effect of the enhanced channel electron current and higher hole injection from the thick p$^+$ drain results in an efficient conductivity modulation at the thick offset region. This results in a higher current drive in the EC-CMTFT.

Figure 11:
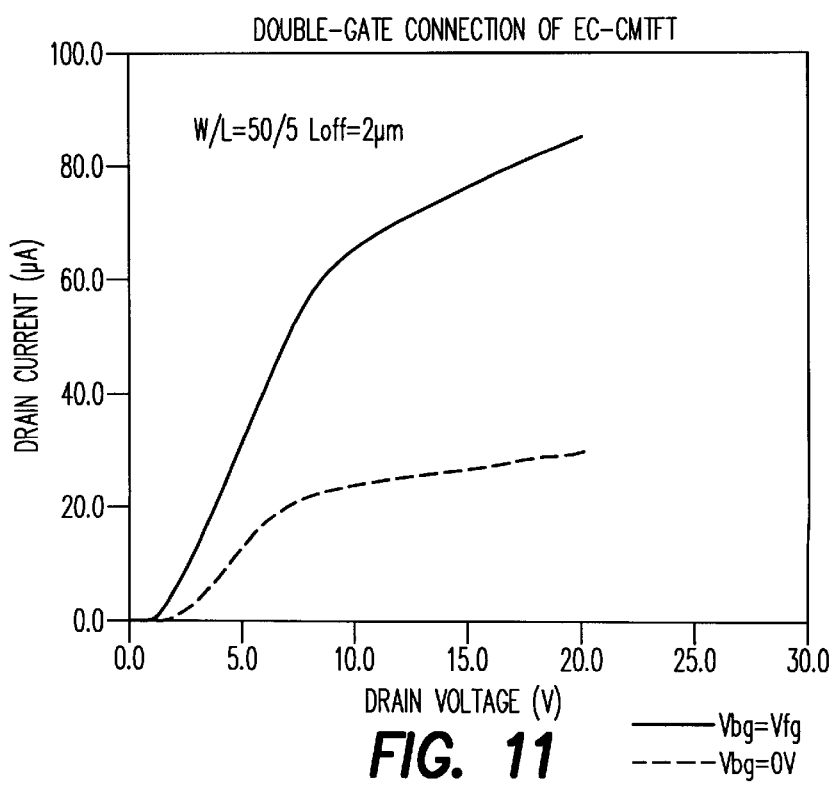
FIG. 11 shows the IV characteristics of the transistor of FIG. 8 with single and double gate operation at a front gate bias of 10V.

The back gate used for elevating the channel region can be tied to the front gate so that using the double gate connection the channel is fully depleted and is more efficiently modulated by both the gates. FIG. 11 shows IV characteristics for the single- and double-gate operation at a front gate bias of 10V. Approximately four times improvement in current drive is obtained at a drain voltage of 20V. This result indicates that because of the very thin channel, the entire channel is inverted in the double gate operation whereas only the top surface is inverted in the single gate operation. When the channel current increases using the double gate operation, correspondingly the hole injection from the drain also increases due to a high electron population at the offset region. Thus a four times enhancement in drive current is obtained in the double gate operation.

We claim:

1. A semiconductor memory unit formed on an insulating substrate and comprising, a first patterned polysilicon layer formed on said substrate and comprising a back plate, a first oxide layer on said first polysilicon layer and on said substrate, a second polysilicon layer comprising a thin drain region over said back plate and relatively thick source and channel regions to one side of said back plate, a second oxide layer on said second polysilicon layer and on said first oxide layer, a third polysilicon layer on said second oxide layer and generally overlying said channel region and serving as a floating gate, a third oxide layer formed on said floating gate and said second oxide layer, and a fourth polysilicon layer comprising a control gate and deposited on said third oxide layer over said floating gate.

2. A thin film transistor comprising a source and a drain, each being formed of a doped polysilicon material on an insulating substrate, said source and said drain being spaced apart by undoped polysilicon material which forms the channel region and by an offset region, wherein said source comprises primarily a material of one conductivity and said drain comprises a material of opposite conductivity, whereby in said offset region conduction is by both electron and hole carriers, and wherein said channel region comprises a polysilicon layer sandwiched between front and back gates and wherein said channel region is thin compared to said offset region and said source and said drain.

* * * * *

UNITED STATES PATENT AND TRADEMARK OFFICE
CERTIFICATE OF CORRECTION

PATENT NO. : 5,982,004
DATED : November 9, 1999
INVENTOR(S) : Johnny Kin On Sin and Anish Kumar Kottarath Parambil It is certified that error appears in the above-identified patent and that said Letters Patent is hereby corrected as shown below:

Title page item [73], should read -- The Hong Kong University of Science & Technology

Signed and Sealed this

Seventh Day of November, 2000

Attest:

Q. TODD DICKINSON

*Attesting Officer*   *Director of Patents and Trademarks*